United States Patent
Kako et al.

(10) Patent No.: US 7,683,378 B2
(45) Date of Patent: Mar. 23, 2010

(54) LIGHT EMITTING DIODE AND METHOD FOR FABRICATING SAME

(75) Inventors: Manabu Kako, Tokyo (JP); Takehiko Tani, Tokyo (JP); Taiichiro Konno, Tokyo (JP); Masahiro Arai, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 522 days.

(21) Appl. No.: 11/359,528

(22) Filed: Feb. 23, 2006

(65) Prior Publication Data

US 2006/0192211 A1 Aug. 31, 2006

(30) Foreign Application Priority Data

Feb. 25, 2005 (JP) .............................. 2005-051657

(51) Int. Cl.
*H01L 33/00* (2006.01)
(52) U.S. Cl. .............................. 257/79; 257/80; 257/95; 257/103; 257/318; 257/E33.001; 257/E33.054; 257/E25.028; 257/E25.032; 257/13
(58) Field of Classification Search ........... 257/79–103, 257/318, E51.018, E33.001, E25.028, E25.032
See application file for complete search history.

(56) References Cited

U.S. PATENT DOCUMENTS 7,180,100 B2 * 2/2007 Takahashi et al. ........... 257/101

2002/0011600 A1 1/2002 Kurahashi et al.
2002/0145147 A1 * 10/2002 Chiou et al. .................. 257/79
2003/0038284 A1 * 2/2003 Kurahashi et al. ............. 257/14

FOREIGN PATENT DOCUMENTS

| JP | 2000-174332 A | 6/2000 |
| JP | 2003-218386 A | 7/2003 |
| TW | 480752 B | 3/2002 |

\* cited by examiner

*Primary Examiner*—Wael Fahmy
*Assistant Examiner*—Marc Armand
(74) *Attorney, Agent, or Firm*—Foley & Lardner LLP

(57) ABSTRACT

An AlGaInP based light emitting diode is provided with a distributed Bragg reflector comprising a combination of an AlGaAs layer and an AlInP layer, each having a film thickness determined by following formulas (1) to (3):

$$t_1 = \{\lambda_0/(4 \times n_1)\} \times \alpha \quad (1),$$

$$t_2 = \{\lambda_0/(4 \times n_2)\} \times (2-\alpha) \quad (2), \text{ and}$$

$$0.5 < \alpha < 0.9 \quad (3)$$

wherein $t_1$ is a film thickness [nm] of the AlGaAs layer, $t_2$ is a film thickness [nm] of the AlInP layer, $\lambda_0$ is a wavelength [nm] of a light to be reflected, $n_1$ is a refractive index of the AlGaAs layer to the wavelength of the light to be reflected, and $n_2$ is a refractive index of the AlInP layer to the wavelength of the light to be reflected.

8 Claims, 4 Drawing Sheets

3: n-TYPE DISTRIBUTED BRAGG REFLECTOR
n-TYPE AlGaAs LAYER(30.7nm)/n-TYPE AlInP LAYER(71.2nm)

FIG. 1
PRIOR ART

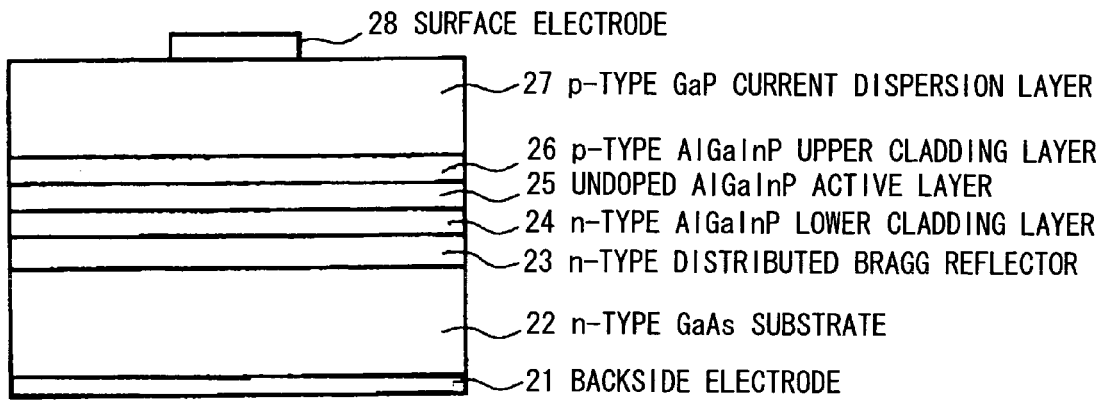

28 SURFACE ELECTRODE
27 p-TYPE GaP CURRENT DISPERSION LAYER
26 p-TYPE AlGaInP UPPER CLADDING LAYER
25 UNDOPED AlGaInP ACTIVE LAYER
24 n-TYPE AlGaInP LOWER CLADDING LAYER
23 n-TYPE DISTRIBUTED BRAGG REFLECTOR
22 n-TYPE GaAs SUBSTRATE
21 BACKSIDE ELECTRODE

23: n-TYPE DISTRIBUTED BRAGG REFLECTOR
  n-TYPE GaAs LAYER(30.7nm)/n-TYPE AlInP LAYER(71.2nm)

24-26: AlGaInP QUATERNERY DOUBLE HETERO STRUCTURE

FIG. 2
PRIOR ART

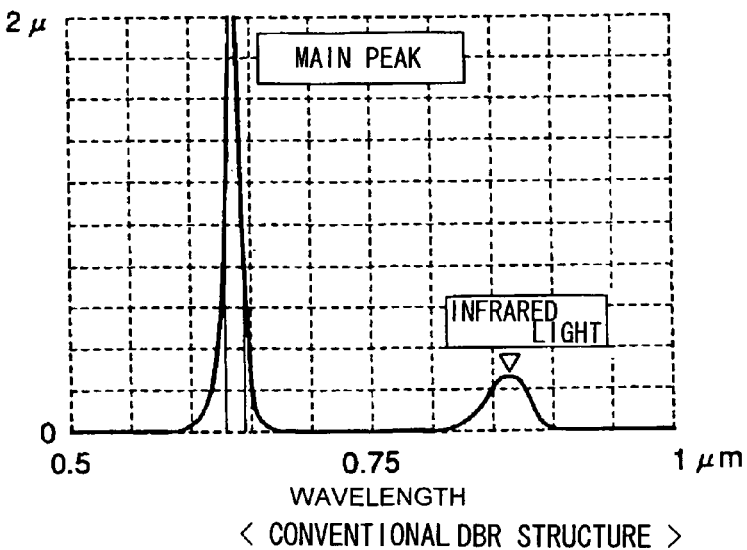

< CONVENTIONAL DBR STRUCTURE >

3: n-TYPE DISTRIBUTED BRAGG REFLECTOR
n-TYPE AlGaAs LAYER(30.7nm)/n-TYPE AlInP LAYER(71.2nm)

< RELATIONSHIP BETWEEN COEFFICIENT $\alpha$ AND
SPECTRUM AREA OF DISTRIBUTED BRAGG REFLECTOR >

< DBR STRUCTURE OF THE INVENTION >

3: n-TYPE DISTRIBUTED BRAGG REFLECTOR
   n-TYPE AlGaAs LAYER (30.7nm)/n-TYPE AlInP LAYER (71.2nm)

LIGHT EMITTING DIODE AND METHOD FOR FABRICATING SAME

The present application is based on Japanese Patent Application No. 2005-051657 filed on Feb. 25, 2005 the entire contents of which are incorporated herein by reference.

BACKGROUND OF THE INVENTION

1. Field of the Invention

The present invention relates to a light emitting diode and a method for fabricating the same, in more particularly, to a high brightness light emitting diode and a method for fabricating the same, by which an emission of a near-infrared light in a distributed Bragg reflector can be reduced to a negligible level, and a malfunction of an optical sensor, etc. using an infrared light can be prevented.

2. Description of the Related Art

Recently, a demand of high brightness light emitting diodes for red light to green light, which are fabricated by using an AlGaInP-based epitaxial wafer, is largely developed. Main demands are backlight for a liquid crystal display of a cellular phone, indication lamp, signal lamp for traffic, brake lamp of automobile, etc. The AlGaInP is a direct transition type semiconductor having the largest bandgap among group III-V compound semiconductor other than nitrides. Therefore, comparing with a conventional light emitting diode using an indirect transition type semiconductor such as GaP or AlGaAs, it is possible to realize a high brightness emission in a visible wavelength range corresponding to green light from red light by using the AlGaInP. In addition, the high brightness light emitting diode that is generally manufactured and sold has extremely high internal quantum efficiency. Accordingly, so as to realize a higher brightness than the conventional high brightness light emitting diode, it is effective to improve an external quantum efficiency rather than the internal quantum efficiency. As means for improving the external quantum efficiency, a light emitting diode in which a distributed Bragg reflector (DBR) is inserted is proposed.

FIG. 1 shows a structure of a conventional AlGaInP-based light emitting diode having an emission wavelength of 630 nm, which is disclosed by Japanese Patent Laid-Open No. 2003-218386 (JP-A-2003-218386).

In the conventional AlGaInP-based light emitting diode, as shown in FIG. 1, on a n-type GaAs substrate 22, a distributed Bragg reflector (DBR) 23 comprising a multi-layered film which is made by layering a high refractive index film and a low refractive index film alternately, a n-type AlGaInP lower cladding layer 24, an undoped AlGaInP active layer 25, a p-type AlGaInP upper cladding layer 26, and a p-type GaP current dispersion layer 27 are sequentially grown by metalorganic vapor phase epitaxy (MOVPE method), and a backside electrode (n-side common electrode) 21 is provided on a whole backside surface of the n-type GaAs substrate 22, and a surface electrode (p-side Ohmic contact electrode) 28 is provided on a part of a surface of the p-type GaP current dispersion layer 27. The n-type AlGaInP lower cladding layer 24, the undoped AlGaInP active layer 25, and the p-type AlGaInP upper cladding layer 26 constitute an AlGaInP quaternary double hetero structure part (light emitting part).

The distributed Bragg reflector 23 comprises a multi-layered film which is made of alternatively layering a high refractive index film having a film thickness of λ/4 n and a low refractive index film having a film thickness of λ/4 n, wherein an emission wavelength of the LED is λ and a refractive index is n. The distributed Bragg reflector 23 has a function of reflecting a light advancing to a lower direction (a direction of the GaAs substrate) which is a part of a light generated in the active layer to an upper direction (a direction for taking out the light) thereby improving an efficiency for taking out the light. By this effect, an improvement in the brightness for 50% or more (about 100% in the case) can be realized, in comparison with the LED in which the distributed Bragg reflector is not interposed.

In the LED comprising an AlGaInP mixed crystal as a light emitting layer, a combination of GaAs layer and $Al_xGa_{1-x}As$ layer ($0 \leq X \leq 1$), a combination of GaAs layer and $(Al_xGa_{1-x})_{1-y}In_yP$ layer ($0 \leq X \leq 1$, $0 \leq y \leq 1$), etc. are generally used as materials constituting the distributed Bragg reflector 23. In addition, as a material constituting the distributed Bragg reflector 23, a combination of AlAs layer and AlGaAs layer having a higher refractive index and higher reflective index is known.

On the other hand, in JP-A-2003-218386, a distributed Bragg reflector comprising a combination of the GaAs layer and AlInP layer is used. The reasons therefor are explained as follows. In the distributed Bragg reflector comprising the combination of the AlAs layer and AlGaAs layer, a manufacturing condition of the AlAs layer is very difficult, and it is easily contaminated with oxygen (O), so that a crystallinity of the light emitting layer grown thereon is deteriorated remarkably, thereby causing a deterioration of the brightness. In addition, if a method for increasing a supplying amount ratio of group V source and group III source (so-called V/III ratio) is adopted so as to prevent the oxygen mixture, a heavy load is charged on the manufacturing apparatus, so that a discharge pipe is easily blocked with As dusts.

Accordingly, in the distributed Bragg reflector comprising the GaAs layer and AlInP layer shown by JP-A-2003-218386, it is proposed that a thickness of the GaAs layer is made as thin as possible, such that a light absorbed in the GaAs layer is reduced to provide a high reflective index, while the AlInP layer is made thick, such that a light having a desired wavelength to be reflected can be reflected.

A film thickness $t_1$ of the GaAs layer and a film thickness $t_2$ of the AlInP layer required for manufacturing such a distributed Bragg reflector with a high reflective index can be determined by following formulas:

$$t_1 = \{\lambda_0/(4 \times n_1)\} \times \alpha,$$

$$t_2 = \{\lambda_0/(4 \times n_2)\} \times (2-\alpha), \text{ and}$$

$$0.5 < \alpha < 0.9$$

wherein $t_1$ is a film thickness [nm] of the GaAs layer, $t_2$ is a film thickness [nm] of the AlInP layer, $\lambda_0$ is a wavelength [nm] of a light to be reflected, $n_1$ is a refractive index of the GaAs layer to the wavelength of the light to be reflected, and $n_2$ is a refractive index of the AlInP layer to the wavelength of the light to be reflected.

The distributed Bragg reflector is manufactured by layering alternately the GaAs layer and AlInP layer each having a film thickness thus calculated for several dozens of times.

As a material composing the distributed Bragg reflector 23 other than the aforementioned examples, Japanese Patent Laid-Open No. 2000-174332 (JP-A-2000-174332) discloses that AlGaAs is used for both of the low refractive index film and the high refractive index film.

However, there is a major problem in the LED using the distributed Bragg reflector comprising the combination of the GaAs layer and AlInP layer disclosed by the JP-A-2003-218386. In such a LED, a light having a wavelength of 630 nm is emitted from the active layer as a main light (main peak in a light emission of the LED) shown in FIG. 2. In addition to this main light, a near-infrared light having an emission wavelength of 860 nm is unintentionally emitted from the GaAs layer due to a light advanced from the active layer to the distributed Bragg reflector as shown in FIG. 2 (the emission of the LED) The near-infrared light thus occurred has a considerable intensity, and this near-infrared light is emitted to the outside together with the main light emitted from the active layer.

The intensity of the near-infrared light having the emission wavelength of 860 nm is about 1/10 of the main light having the emission wavelength of 630 nm. This near-infrared light may cause malfunction of a sensor using the infrared light, which is widely spread.

Further, in the distributed Bragg reflector comprising the combination of the GaAs layer and AlInP layer disclosed by JP-A-2003-218386, there is a further disadvantage in that a part of the light is absorbed by the GaAs layer without being reflected, so that the LED becomes darkened (the brightness of the LED is deteriorated).

Accordingly, it is an object of the invention to provide a high brightness light emitting diode and a method for fabricating the same, in which an emission of a near-infrared light in a distributed Bragg reflector is reduced to a negligible level, and a light absorptance in the distributed Bragg reflector is lowered.

So as to achieve the object of the invention, the present invention is characterized by following features.

According to a first feature of the invention, a light emitting diode, comprises:

a first conductivity type substrate;

a first conductivity type distributed Bragg reflector comprising a multi-layered film which is made by layering a high refractive index film composed of an AlGaAs layer and a low refractive index film composed of an AlInP layer as alternately; and a light emitting part comprising an active layer sandwiched between a first conductivity type lower cladding layer and a second conductivity type upper cladding layer.

According to a second feature of the invention, in the light emitting diode, the first conductivity type distributed Bragg reflector is interposed between the first conductivity lower cladding layer and the first conductivity type substrate.

According to a third feature of the invention, the light emitting diode, further comprises:

a second conductivity type current dispersion layer grown on the light emitting part.

According to a fourth feature of the invention, in the light emitting diode, a film thickness of each of the AlGaAs layer and AlInP layer constituting the first conductivity type distributed Bragg reflector is determined by following formulas (1) to (3):

$$t_1 = \{\lambda_0/(4 \times n_1)\} \times \alpha \quad (1),$$

$$t_2 = \{\lambda_0/(4 \times n_2)\} \times (2-\alpha) \quad (2), \text{ and}$$

$$0.5 < \alpha < 0.9 \quad (3)$$

wherein $t_1$ is a film thickness [nm] of AlGaAs layer, $t_2$ is a film thickness [nm] of AlInP layer, $\lambda_0$ is a wavelength [nm] of a light to be reflected, $n_1$ is a refractive index of the AlGaAs layer to the wavelength of the light to be reflected, and $n_2$ is a refractive index of the AlInP layer to the wavelength of the light to be reflected.

According to a fifth feature of the invention, in the light emitting diode, the high refractive index film composed of AlGaAs layer is expressed as $Al_xGa_{1-x}As$ layer wherein Al mixed crystal ratio x is $0 < x < 0.6$.

According to a sixth feature of the invention, in the light emitting diode, the first conductivity type substrate is GaAs, and the light emitting part is composed of AlGaInP or GaInP.

According to a seventh feature of the invention, a method for fabricating a light emitting diode, comprises steps of:

providing a first conductivity type substrate;

providing a first conductivity type distributed Bragg reflector by growing an AlGaAs layer and an AlInP layer alternately on the first conductivity type substrate by a MOVPE method; and sequentially growing a first conductivity type AlGaInP cladding layer, an undoped AlGaInP active layer, a second conductivity type AlGaInP cladding layer, and a second conductivity type current dispersion layer by the MOVPE method;

wherein:

a film thickness of each of the AlGaAs layer and AlInP layer constituting the first conductivity type distributed Bragg reflector is determined by following formulas (1) to (3):

$$t_1 = \{\lambda_0/(4 \times n_1)\} \times \alpha \quad (1),$$

$$t_2 = \{\lambda_0/(4 \times n_2)\} \times (2-\alpha) \quad (2), \text{ and}$$

$$0.5 < \alpha < 0.9 \quad (3)$$

wherein $t_1$ is a film thickness [nm] of the AlGaAs layer, $t_2$ is a film thickness [nm] of the AlInP layer, $\lambda_0$ is a wavelength [nm] of a light to be reflected, $n_1$ is a refractive index of the AlGaAs layer to the wavelength of the light to be reflected, and $n_2$ is a refractive index of the AlInP layer to the wavelength of the light to be reflected.

SUMMARY OF THE INVENTION

The major problem in the conventional distributed Bragg reflector comprising pairs of the AlInP layer and GaAs layer is that the main light (emission wavelength of 630 nm, hereinafter referred as a "first emission light") having a wavelength range corresponding to a bandgap of the active layer as well as an intense near-infrared light (emission wavelength of 860 nm, hereinafter referred as a "second emission light") having a wavelength range corresponding to a bandgap of the GaAs layer are simultaneously emitted (cf. FIG. 2). The reason why the intense near-infrared light (the second emission light) is emitted is explained as below. In FIG. 2, most of the light advancing to the n-type GaAs substrate 22 and the n-type distributed Bragg reflector 23 among the light emitted from the active layer 25 is reflected by the n-type distributed Bragg reflector 23 to a main light take-out surface, which is provided at an opposite side of the n-type distributed Bragg reflector 23. However, a part of the first emission light is incident to the GaAs layer in the combination of the GaAs layer and AlInP layer constituting the n-type distributed Bragg reflector 23. A photo excitation is caused by the first emission light incident to the GaAs layer, so that a light having a wavelength range corresponding to the bandgap of GaAs layer is emitted. Namely, in the light emitting diode using the GaAs layer as one of paired materials constituting the n-type distributed Bragg reflector 23, the intense second emission light is inevitably emitted. Therefore, there is a disadvantage in that, when the sensor using the infrared light e.g. a commonly used semiconductor photodiode is provided in a circumference of such light emitting diode, the photodiode may react to the near-infrared light (second emission light) emitted from the light emitting diode, thereby causing the malfunction of the photodiode.

Accordingly, in the present invention, the AlGaAs layer and AlInP layer are used as materials of a high refractive index film and a low refractive index film constituting a distributed Bragg reflector. In other words, the AlGaAs layer is used as the high refractive index film instead of the conventional GaAs layer. According to the present invention, the near-infrared light emitted from the distributed Bragg reflector is reduced to the negligible level as shown in FIG. 5. Therefore, in the light emitting diode of the present invention, even if the sensor using the infrared light is provided in the circumference of the light emitting diode, the malfunction of the sensor by reacting to the near-infrared light (second emission light) emitted from the light emitting diode can be prevented.

Further, according to the present invention, in the pair of films constituting the distributed Bragg reflector, the AlGaAs layer which absorbs the light is made as thin as possible, while the AlInP layer is made thick to reflect a light having a desired wavelength to be reflected. Therefore, the high brightness light emission diode can be realized.

Still further, according to the present invention, the light emitting diode having brightness higher than the conventional light emitting diode can be realized, only by changing a film thickness ratio of AlGaAs layer and AlInP layer of distributed Bragg reflector.

In the commonly used distributed Bragg reflector comprising the combination of AlAs layer and AlGaAs layer, a manufacturing condition of AlAs layer is very difficult, and it is easily contaminated with oxygen (O), so that a crystallinity of the light emitting layer grown thereon is deteriorated remarkably, thereby causing a deterioration of the brightness. In addition, if a method for increasing a supplying amount ratio of group V source and group III source (so-called V/III ratio) is adopted so as to prevent the oxygen mixture, a heavy load is charged on the manufacturing apparatus, so that a discharge pipe is easily blocked with As dusts. However, according to the present invention, since the distributed Bragg reflector comprising the combination of the AlGaAs layer and AlInP layer is provided, it is possible to easily fabricate the distributed Bragg reflector with high reflective index, which is suitable to be produced without causing such a problem.

EFFECTS OF THE INVENTION

According to the present invention, following excellent effects can be obtained.

According to the present invention, since the AlGaAs layer and AlInP layer are used as materials of a high refractive index film and a low refractive index film constituting a distributed Bragg reflector, the near-infrared light emitted from the distributed Bragg reflector is reduced to the negligible level. Therefore, even if the sensor using the infrared light is provided in the circumference of the light emitting diode according to the present invention, the malfunction of the sensor by reacting to the near-infrared light emitted from the light emitting diode can be prevented.

Further, according to the present invention, the AlGaAs layer which absorbs the light is made as thin as possible, while the AlInP layer is made thick to reflect a light having a desired wavelength to be reflected. Therefore, the light emission diode with high brightness can be realized.

Still further, according to the present invention, the light emitting diode with brightness higher than the conventional light emitting diode can be realized, only by changing a film thickness ratio of AlGaAs layer and AlInP layer of the distributed Bragg reflector.

BRIEF DESCRIPTION OF THE DRAWINGS

Preferred embodiments according to the present invention will be explained in conjunction with appended drawings, wherein:

FIG. 1 is an explanatory diagram showing a structure of a conventional light emitting diode;

FIG. 2 is a graph showing a light emission spectrum of the conventional light emitting diode;

DESCRIPTION OF THE PREFERRED EMBODIMENTS

Next, a light emitting diode and a method for fabricating the same in preferred embodiments according to the present invention will be explained in more detail in conjunction with the appended drawings.

Figure 3:
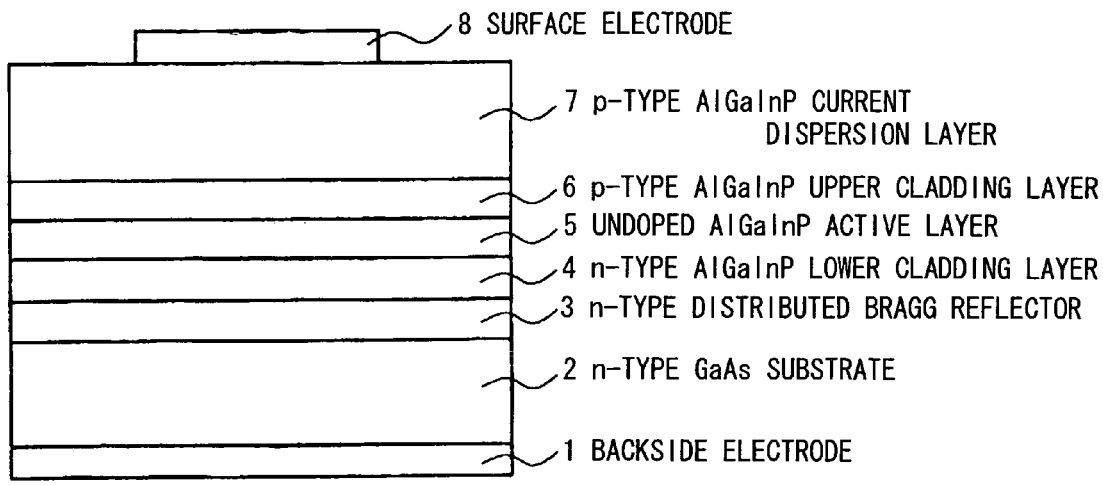
FIG. 3 is an explanatory diagram showing a structure of a light emitting diode in a first preferred embodiment according to the present invention.

FIG. 3 is an explanatory diagram showing a structure of a light emitting diode in a first preferred embodiment according to the present invention. Herein, a first conductivity type is n-type and a second conductivity type is p-type.

In a light emitting diode, on a n-type GaAs substrate 2 (as a first conductivity type substrate), a n-type distributed Bragg reflector (DBR) 3 comprising a multi-layered film which is made by layering a n-type AlGaAs layer (as a high refractive index films) and a n-type AlInP layer (as a low refractive index films) alternately. Further, on the n-type distributed Bragg reflector 3, a double hetero structure light emitting part (light emitting region layer) comprising a n-type AlGaInP lower cladding layer 4 (as a first conductivity type lower cladding layer), an undoped AlGaInP active layer 5, and a p-type AlGaInP upper cladding layer 6 (as a second conductivity type upper cladding layer) is formed. Herein, a n-type GaAs buffer layer may be provided between the n-type GaAs substrate 2 and the n-type distributed Bragg reflector 3.

Further, on the light emitting part, more precisely on the p-type AlGaInP upper cladding layer 6, a p-type AlGaInP current dispersion layer 7 (as a second conductivity type current dispersion layer) is grown. Still further, a surface electrode 8 composing a circular partial electrode is provided at a center of a surface of a chip, and a backside electrode 1 composing a n-side metal electrode is totally or partially provided on a backside surface of the chip.

A film thickness $t_1$ of AlGaAs layer and a film thickness $t_2$ of AlInP layer constituting a distributed Bragg reflector 3 can be determined by following formulas (1) to (3):

$$t_1 = \{\lambda_0/(4 \times n_1)\} \times \alpha \quad (1),$$

$$t_2 = \{\lambda_0/(4 \times n_2)\} \times (2-\alpha) \quad (2), \text{ and}$$

$$0.5 < \alpha < 0.9 \quad (3)$$

wherein $t_1$ is a film thickness [nm] of the AlGaAs layer, $t_2$ is a film thickness [nm] of the AlInP layer, $\lambda_0$ is a wavelength [nm] of a light to be reflected, $n_1$ is a refractive index of the AlGaAs layer to the wavelength of the light to be reflected, and $n_2$ is a refractive index of the AlInP layer to the wavelength of the light to be reflected.

Figure 4:
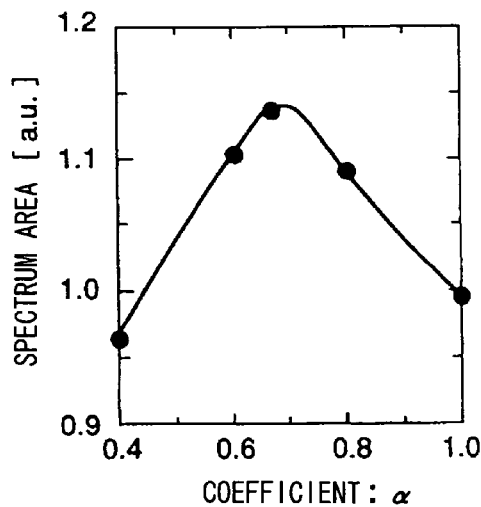
FIG. 4 is a graph showing a relationship between a coefficient a used in formulas and a spectrum area of a distributed Bragg reflector in the first preferred embodiment according to the present invention.

FIG. 4 is a graph showing a relationship between a coefficient a used in formulas and a spectrum area of a distributed Bragg reflector in the first preferred embodiment according to the present invention.

An improvement in brightness of a light emitting diode is admitted in a distributed Bragg reflector, wherein the coefficient a is within a range of $0.5<\alpha<0.9$, in comparison with a conventional distributed Bragg reflector wherein $\alpha=1$ (i.e. a film thickness of a high refractive index film and a film thickness of a low refractive index film are made equal to $\lambda/4$ n). In other words, as clearly understood from FIG. 4, when the coefficient a is within a range of $0.5<\alpha<0.9$, preferably within a range of $0.6 \leqq \alpha \leqq 0.8$, and more preferably about 0.7, a spectrum area [a.u. (arbitrary unit)] of the distributed Bragg reflector becomes greater in comparison with the conventional distributed Bragg reflector wherein $\alpha=1$ (i.e. a film thickness of a high refractive index film and a film thickness of a low refractive index film are made equal to $\lambda/4$ n). Therefore, the distributed Bragg reflector with higher reflective index can be obtained.

Figure 5:
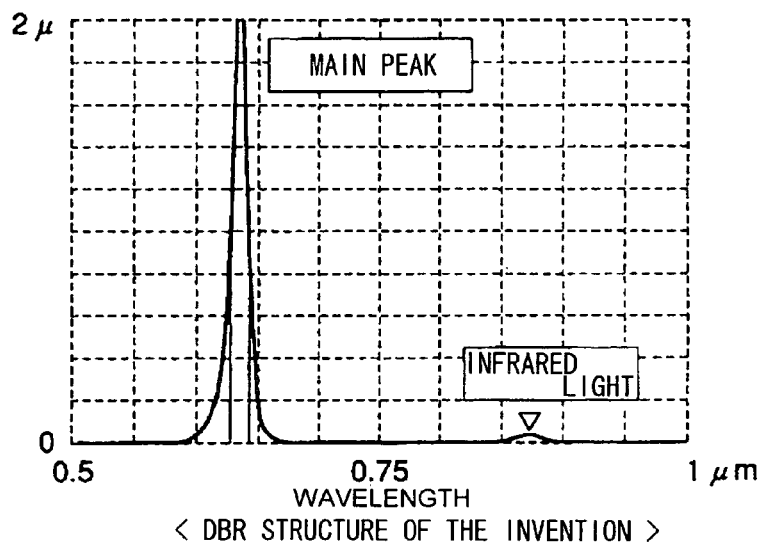
FIG. 5 is a graph showing a light emission spectrum of the light emitting diode in the first preferred embodiment according to the present invention.

FIG. 5 is a graph showing a light emission spectrum of the light emitting diode having the distributed Bragg reflector in the first preferred embodiment according to the present invention.

In the conventional distributed Bragg reflector comprising pairs of the GaAs layer and AlInP layer, an intensity of the near-infrared light from the GaAs layer is about 1/10 of a main light (a main peak of a light emission as shown in FIG. 2). However, in the distributed Bragg reflector 3 comprising pairs of the AlGaAs layer and AlInP layer in the first preferred embodiment, the near-infrared light taken out to the outside is about 1/60 or less of the main light, namely, the near-infrared light is reduced to the substantially negligible level as shown in FIG. 5. Therefore, even if the general type semiconductor photodiode is provided in the circumference of the light emitting diode in the first preferred embodiment, the photodiode does not react to the near-infrared light emitted from the light emitting diode, and the malfunction of the photodiode can be prevented.

Next, the light emitting diode (LED) shown in FIG. 3 will be explained in more detail.

By using the MOVPE method, on a n-type GaAs substrate 2, a distributed Bragg reflector (DBR) 3 comprising 20 pairs of a n-type AlGaAs layer (film thickness of 30.7 nm, carrier concentration of $1 \times 10^{18}$ cm$^{-3}$) as a high refractive index film and a n-type AlInP layer (film thickness of 71.2 nm, carrier concentration of $1 \times 10^{18}$ cm$^{-3}$) as a low refractive index film, which are alternately grown. On the distributed Bragg reflector 3, a n-type AlGaInP lower cladding layer 4 (film thickness of 0.5 μm, carrier concentration of $1 \times 10^{18}$ cm$^{-3}$), an undoped AlGaInP active layer 5 (film thickness of 0.5 μm), and a p-type AlGaInP upper cladding layer 6 (film thickness of 0.5 μm, carrier concentration of $5 \times 10^{17}$ cm$^{-3}$) are sequentially grown. Further, a p-type AlGaInP current dispersion layer 7 (film thickness of 5 μm, carrier concentration of $1 \times 10^{18}$ cm$^{-3}$) is grown thereon.

Herein, as the current dispersion layer 7, a transparent conductive film such as ITO film, GaAlAs or GaP can be used other than AlGaInP.

A LED chip shown in FIG. 3 is manufactured by using an epitaxial wafer thus fabricated, and characteristic evaluation is conducted. A light emission power is increased to 2.8 mW that is an increase for about 15%, and an operating voltage (Vf characteristic) of the LED is 1.9 V that is not changed in comparison with the LED chip using a conventional distributed Bragg reflector wherein $\alpha=1$ (i.e. a film thickness of a high refractive index film and a film thickness of a low refractive index film are made equal to $\lambda/4$ n). In other words, concerning the light emission power and operating voltage characteristic, the excellent results that are approximately equal to the conventional LED disclosed in JP-A-2003-218386 are maintained.

On the other hand, an intensity of the near-infrared light taken out to the outside from the light emitting diode, which is a major issue in the present invention, is reduced to the negligible level as shown in FIG. 5. As a result, even if the commonly used semiconductor photodiode is provided in a circumference of the light emitting diode, the photodiode does not react to the near-infrared light.

In the first preferred embodiment, a structure of the light emitting diode having the current dispersion layer 7 is described. However, the present invention is not limited thereto, and can be applied to a structure of the light emitting diode in which the current dispersion layer 7 is omitted from the structure shown in FIG. 3.

Figure 6:
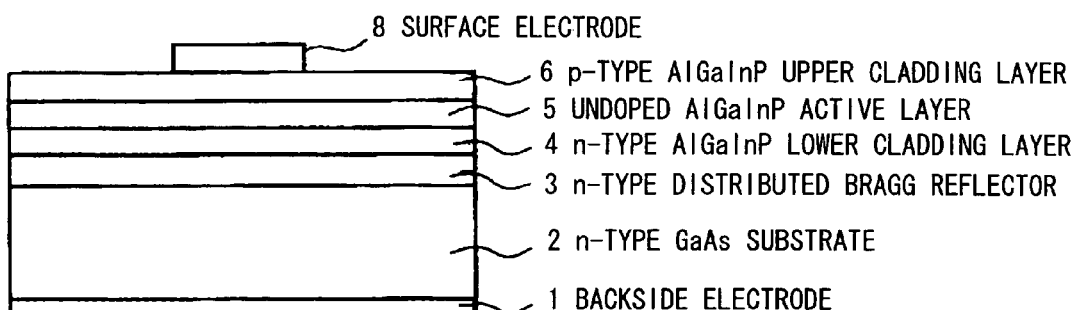
FIG. 6 is an explanatory diagram showing a structure of a light emitting diode in a second preferred embodiment according to the present invention.

FIG. 6 is an explanatory diagram showing a structure of a light emitting diode in a second preferred embodiment according to the present invention.

In concrete, as shown in FIG. 6, on a n-type GaAs substrate 2 (as a first conductivity type substrate), a n-type distributed Bragg reflector (DBR) 3 comprising a multi-layered film which is made by layering a n-type AlGaAs layer (as a high refractive index film) and a n-type AlInP layers (as a low refractive index film) alternately in accordance with the formulas (1) and (2). Further, on the n-type distributed Bragg reflector 3, a double hetero structure light emitting part comprising a n-type AlGaInP lower cladding layer 4, an undoped AlGaInP active layer 5, and a p-type AlGaInP upper cladding layer 6 is formed. Further, on the light emitting part, more precisely on the p-type AlGaInP upper cladding layer 6, a surface electrode 8 is provided on a surface of the chip, and a backside electrode 1 provided on a backside surface of the chip.

Figure 7:
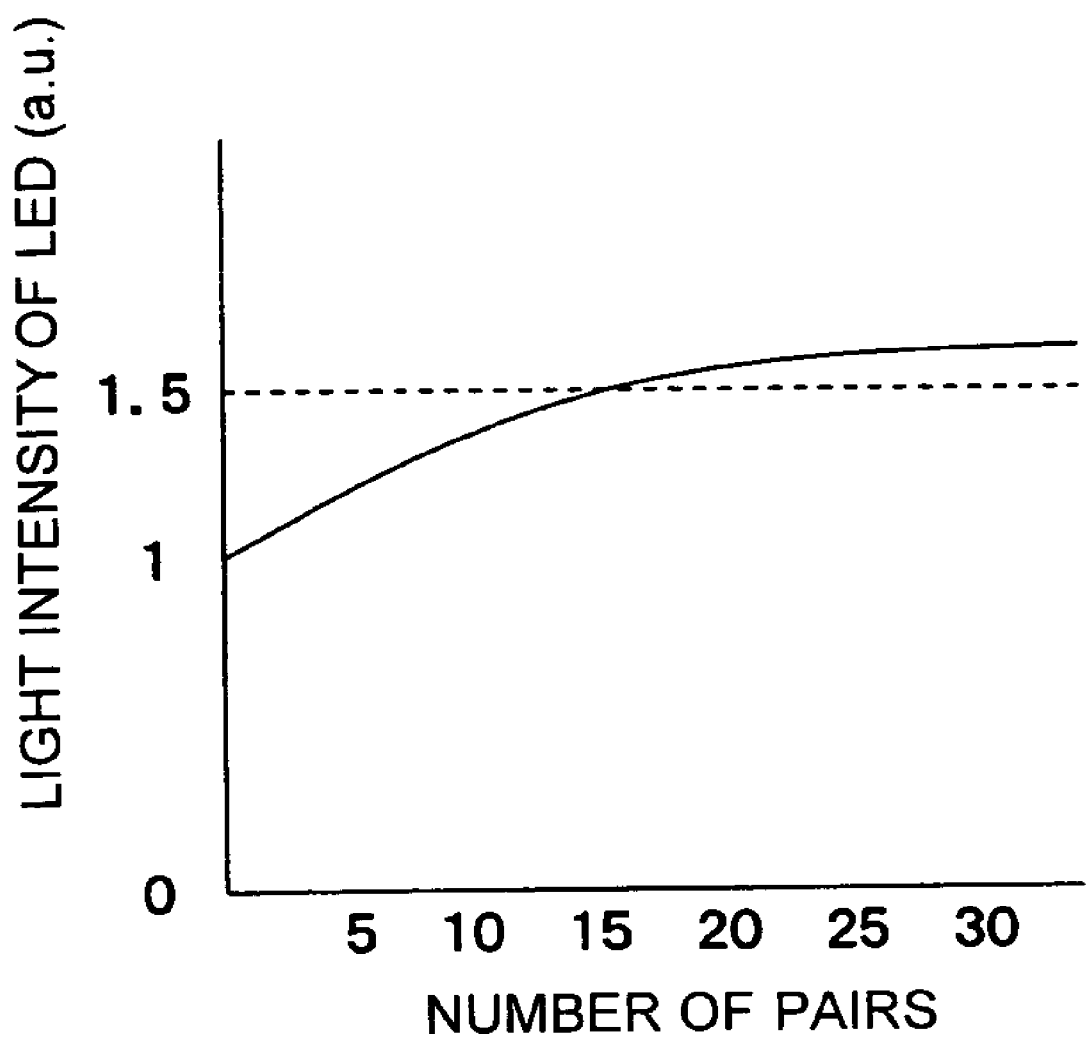
FIG. 7 is a graph showing a relationship between a light intensity of the LED and the number of pairs of n-type AlGaAs layer and n-type AlInP layer in the distributed Bragg reflector.

FIG. 7 is a graph showing a relationship between a light intensity of the LED and the number of pairs of n-type AlGaAs layer and n-type AlInP layer in the distributed Bragg reflector. In the above preferred embodiments, 20 pairs of the n-type AlGaAs layer as a high refractive index film and the n-type AlInP layer as a low refractive index film are alternately grown. As shown in FIG. 7, the light intensity increases monotonously when the number of pairs is from 0 to 15, and slightly increases when the number of pairs is from 15 to 30 then become a saturated state when the number of pairs is around 30. Therefore, the number of pairs is preferably from 15 to 30, more preferably from 15 to 25.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A light emitting diode, comprising:
   a first conductivity type substrate;
   a first conductivity type distributed Bragg reflector comprising a multi-layered film which is made by alternately layering a high refractive index film comprising an AlGaAs layer comprising $Al_xGa_{1-x}As$ wherein an Al mixed crystal ratio x is $0<x<0.6$, and a low refractive index film comprising an AlInP layer; and a light emitting part comprising an active layer sandwiched between a first conductivity cladding layer and a second conductivity cladding layer, wherein:

a film thickness of each of the AlGaAs layer and AlInP layer making up the first conductivity type distributed Bragg reflector is determined by following formulas (1) to (3):

$$t_1 = \{\lambda_0/(4 \times n_1)\} \times \alpha \quad (1),$$

$$t_2 = \{\lambda_0/(4 \times n_2)\} \times (2-\alpha) \quad (2), \text{ and}$$

$$0.5 < \alpha < 0.9 \quad (3)$$

wherein $t_1$ is a film thickness [nm] of the AlGaAs layer, $t_2$ is a film thickness [nm] of the AlInP layer, $\lambda_0$ is a wavelength [nm] of a light to be reflected by the Bragg reflector, $n_1$ is a refractive index of the AlGaAs layer to the wavelength of the light to be reflected by the Bragg reflector, and $n_2$ is a refractive index of the AlInP layer to the wavelength of the light to be reflected by the Bragg reflector.

2. The light emitting diode, according to claim 1, wherein: the first conductivity type distributed Bragg reflector is interposed between the first conductivity cladding layer and the first conductivity type substrate.

3. The light emitting diode, according to claim 1, further comprising:
a second conductivity type current dispersion layer grown on the light emitting part.

4. The light emitting diode, according to claim 1, wherein: the first conductivity type substrate is composed of GaAs, and the light emitting part is composed of AlGaInP or GaInP.

5. The light emitting diode, according to claim 1, further comprising:
a surface electrode provided as an uppermost layer; and
a backside electrode provided on a backside surface of the first conductivity type substrate.

6. The light emitting diode, according to claim 1, wherein the light emitting diode is part of a lighting device or a display.

7. The light emitting diode, according to claim 5, wherein the surface electrode comprises a circular partial electrode.

8. The light emitting diode, according to claim 5, wherein the backside electrode comprises an n-side metal electrode.

* * * * *